United States Patent
Verma

[11] Patent Number: 5,872,332
[45] Date of Patent: Feb. 16, 1999

[54] MOLDED HOUSING WITH EMI SHIELD

[75] Inventor: Shailendra Verma, Indianapolis, Ind.

[73] Assignee: Delco Electronics Corp., Kokomo, Ind.

[21] Appl. No.: 883,989

[22] Filed: Jun. 27, 1997

[51] Int. Cl.[6] .................................................. H05K 9/00
[52] U.S. Cl. ........................ 174/35 C; 361/816; 361/752
[58] Field of Search .............................. 439/76.2, 88, 92, 439/95, 96, 97; 174/35 C, 35 R; 361/753, 799, 800, 816, 818, 752

[56] References Cited

U.S. PATENT DOCUMENTS

| | | | |
|---|---|---|---|
| 5,023,752 | 6/1991 | Detter et al. | 361/399 |
| 5,150,282 | 9/1992 | Tomura et al. | 361/816 |
| 5,206,796 | 4/1993 | Thompson et al. | 361/816 |
| 5,231,561 | 7/1993 | Johnson et al. | 361/424 |
| 5,349,132 | 9/1994 | Miller et al. | 174/35 R |
| 5,375,040 | 12/1994 | Cooper et al. | 361/730 |
| 5,392,197 | 2/1995 | Cuntz et al. | 361/818 |
| 5,430,618 | 7/1995 | Huang | 361/818 |
| 5,703,754 | 2/1996 | Hinze | 361/736 |

*Primary Examiner*—Kristine Kincaid
*Assistant Examiner*—Hung V Ngo
*Attorney, Agent, or Firm*—Jimmy L. Funke

[57] ABSTRACT

A metal shield is stamped from sheet metal into a box shape and tabs are bent up from the housing walls, and posts are extruded from the tabs. The shield is then insert molded into a plastic housing. A connector shroud is molded on one side of the housing and apertures for terminal pins are also formed during molding. Pins are pressed into the aperture and the ends bent up for circuit board connection. Metal bushings insert molded into ears on the housing provide mounting lugs. The tabs are supports for a circuit board and the posts extend through holes in the circuit board and are upset to retain the board without screws.

3 Claims, 1 Drawing Sheet

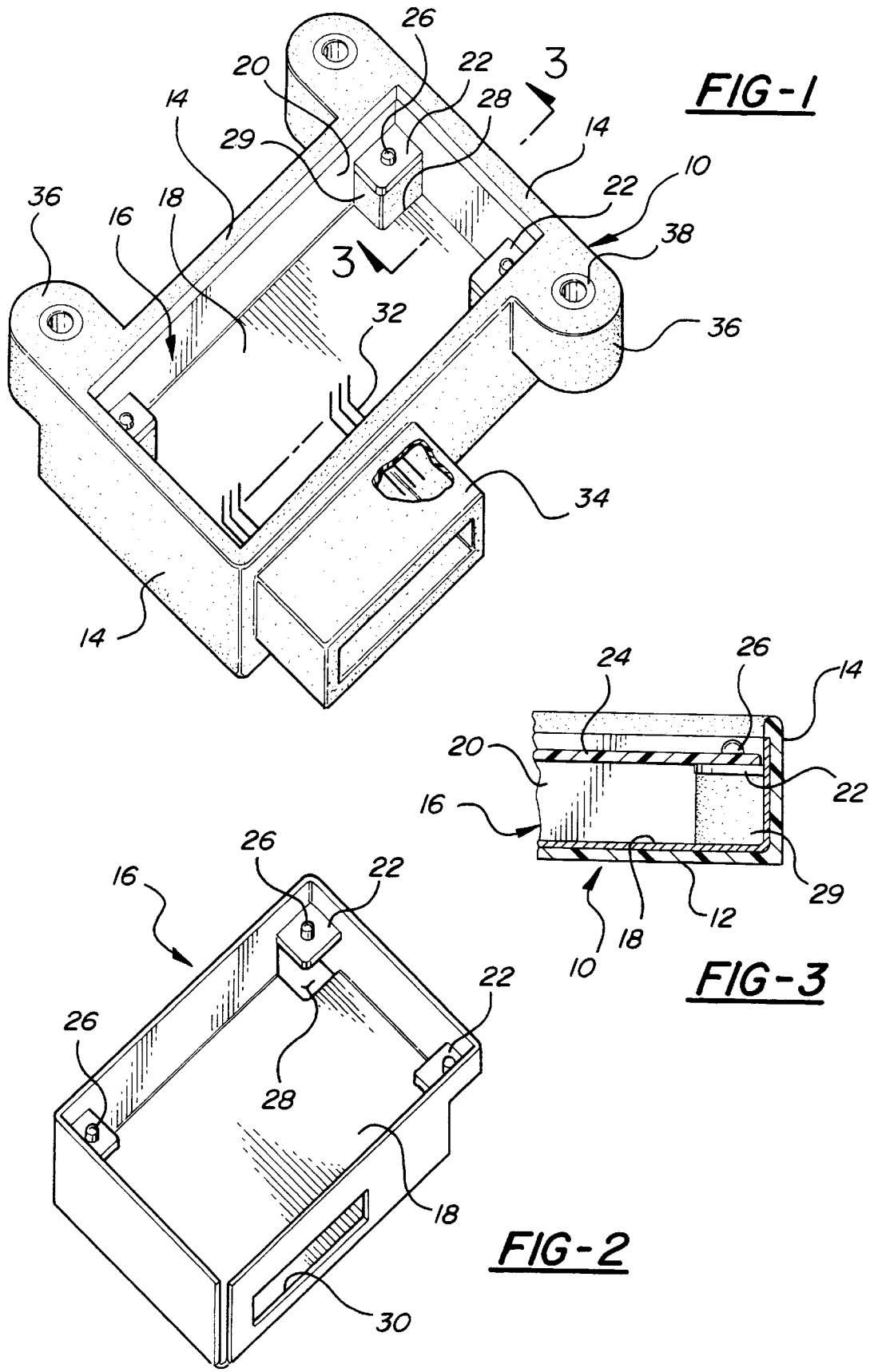

MOLDED HOUSING WITH EMI SHIELD

FIELD OF THE INVENTION

This invention relates to a housing for electronic products and particularly to an integral molded housing with EMI shielding.

BACKGROUND OF THE INVENTION

Electronic packages for automotive products often use die cast housings with separate connectors. It has been proposed previously to use molded plastic housings instead, and to achieve EMI shielding by adding a deep-drawn metal shield to the molded housing.

It is desired, however to have only one piece which meets the requirements for structural support and environmental protection and includes the connector. At the same time it is desired to reduce costs.

SUMMARY OF THE INVENTION

It is therefore an object of the invention to afford a one-piece electronic housing including shielding and connector (though not including a cover).

A sheet metal liner is stamped into a box shape with turned up tabs for circuit board support, extruded posts on the tabs, and an opening for terminal pins. The liner is insert molded into a plastic housing which has an integral connector shroud, and pin apertures are formed inside the shroud during molding. Then pins are inserted through the apertures and the inner ends turned up for insertion into a circuit board. Metal bushings are also insert molded into ears at the housing corners to form mounting lugs.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a partly broken away isometric view of an electronic housing according to the invention;

FIG. 2 is an isometric view of a sheet metal shield for insert molding into the housing; and FIG. 3 is a modified cross section taken along line 3—3 of FIG. 1 with a circuit board added.

DESCRIPTION OF THE INVENTION

The ensuing description is directed to an integrated housing specifically intended for a sensing and diagnostic module of an automotive airbag system, it will be recognized that it has general application to electronics packaging where shielding from electromagnetic interference (EMI) is desired and particularly in automotive applications.

Referring to the drawings, a molded polymer housing 10 has a bottom 12 and four side walls 14 and an open top to be enclosed by a cover, not shown. A stamped sheet metal shield 16, best shown in FIG. 2, is insert molded into the housing to form an inner conductive liner. The shield has a bottom 18 adjacent the housing bottom 12 and sides 20 adjacent the walls 14. Two opposite sides 20 have tabs 22 bent inward parallel to the bottom to provide mounts for a circuit board 24. Each tab has an extruded post 26 which protrudes through a hole in the circuit board and is upset to retain the board, thereby obviating the need for screw fasteners. Openings 28 in the bottom 18 aligned with and shaped like the tabs 22 permit portions 29 of the polymer housing to extend into the shield volume to support the tabs 22.

To afford an integral connector, one side of the shield has a rectangular opening 30 for an array of terminal pins 32 which extend through the corresponding wall. A connector shroud 34 external of the wall surrounds the outer ends of the pins. The inner ends of the pins are bent normal to the housing bottom for connection to the circuit board 24.

External ears or lugs 36 at corners of the housing 10 each contain insert molded metal bushings 38 to enable mounting to a support without stress relaxation caused by mounting screws.

To fabricate the housing, a sheet metal blank, preferably aluminum, is stamped to form the shield 15 with the sides 20, tabs 22, and the opening 30, and posts 26 are extruded. The shield is placed in a mold along with the bushings 38 and the polymer material is injected. A suitable material is 45% glass filled PET (polyethylene terephthalate). Apertures for terminal pins are formed during molding. The connector pins 32 are then pressed into the housing apertures through the shield opening 30 and the inner ends are bent. To complete the electronic package, a circuit board 24 containing the necessary components is placed in the housing with the pins 32 contacting terminal pads on the board, and the posts 26 are cold formed to secure the circuit board into the housing. A cover may then be installed.

It will thus be seen that the housing with integral connector is easily molded and has shielding properties due to the insert molded metal shield. The housing affords mounting and retention of a circuit board without screws and has metal reinforced mounting lugs.

The embodiments of the invention in which an exclusive property or privilege is claimed are defined as follows:

1. A molded housing for an electronic circuit comprising:
   a polymer molding having bottom and side walls defining a cavity;
   a conductive insert in the cavity for EMI protection of the circuit, the conductive insert being defined by a metal stamping lining the cavity and including circuit board mounting means comprising
      tabs extending into the cavity normal to the side walls, and
      deformable posts projecting from the tabs adapted to engage and retain a circuit board; and
   a connector integral with the molding including an array of terminal pins extending through one of the side walls for connection to the circuit.

2. A molded housing for an electronic circuit comprising:
   a polymer molding having bottom and side walls defining a cavity;
   a conductive insert in the cavity for EMI protection of the circuit, the conductive insert being defined by a sheet metal liner in the cavity and including circuit board mounting means comprising
      tabs extending into the cavity normal to the side walls, and deformable posts projecting from the tabs adapted to engage and retain a circuit board; and the walls include protrusions for supporting the tabs; and a connector integral with the molding including an array of terminal pins extending through one of the side walls for connection to the circuit.

3. A molded housing for an electronic circuit comprising:

a polymer molding having bottom and side walls defining a cavity;

a conductive insert in the cavity for EMI protection of the circuit;

a connector integral with the molding including an array of terminal pins extending through one of the side walls for connection to the circuit; and external mounting lugs integral with the molding, and having insert-molded metal bushings for receiving fasteners.

* * * * *